United States Patent
Jiang et al.

(10) Patent No.: US 9,705,024 B2
(45) Date of Patent: Jul. 11, 2017

(54) INVISIBLE LIGHT FLAT PLATE DETECTOR AND MANUFACTURING METHOD THEREOF, IMAGING APPARATUS

(71) Applicant: BOE TECHNOLOGY GROUP CO., LTD., Beijing (CN)

(72) Inventors: Feng Jiang, Beijing (CN); Xingdong Liu, Beijing (CN); Chungchun Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/107,209

(22) PCT Filed: Jan. 26, 2016

(86) PCT No.: PCT/CN2016/072089
§ 371 (c)(1),
(2) Date: Jun. 22, 2016

(87) PCT Pub. No.: WO2017/004981
PCT Pub. Date: Jan. 12, 2017

(65) Prior Publication Data
US 2017/0012067 A1    Jan. 12, 2017

(30) Foreign Application Priority Data
Jul. 9, 2015  (CN) .......................... 2015 1 0401838

(51) Int. Cl.
*H01L 31/102*  (2006.01)
*H01L 21/00*   (2006.01)
(Continued)

(52) U.S. Cl.
CPC ...... *H01L 31/117* (2013.01); *H01L 27/14623* (2013.01); *H01L 27/14632* (2013.01);
(Continued)

(58) Field of Classification Search
CPC .................. H01L 31/117; H01L 27/14676
(Continued)

(56) References Cited

U.S. PATENT DOCUMENTS 8,836,069 B2 *  9/2014  Karim ............. H01L 31/022408
                                                             257/448
2016/0116608 A1 *  4/2016  Kim ........................ G01T 1/241
                                                             250/371

* cited by examiner

*Primary Examiner* — Calvin Lee
(74) *Attorney, Agent, or Firm* — Nath, Goldberg & Meyer; Joshua B. Goldberg; Annie J. Kock

(57) ABSTRACT

The present invention provides an invisible light flat plate detector and a manufacturing method thereof, an imaging apparatus, relates to the field of detection technology, can solve problems that the structure of the invisible light flat plate detector in the prior art is complex and the manufacturing method thereof is tedious. The invisible light flat plate detector of the present invention comprises a plurality of detection units and an invisible light conversion layer provided above the detection units for converting invisible light into visible light, each of the detection units comprising a thin film transistor provided on a substrate, and a first insulation layer, a first electrode, a semiconductor photoelectronic conversion module, a second electrode which are successively provided above the thin film transistor and of which projections on the substrate at least partially overlap with a projection of the thin film transistor on the substrate.

15 Claims, 2 Drawing Sheets

(51) Int. Cl.
*H01L 31/117* (2006.01)
*H01L 27/146* (2006.01)

(52) U.S. Cl.
CPC .. *H01L 27/14658* (2013.01); *H01L 27/14669* (2013.01); *H01L 27/14676* (2013.01)

(58) Field of Classification Search
USPC .......................................... 257/458; 438/57
See application file for complete search history.

INVISIBLE LIGHT FLAT PLATE DETECTOR AND MANUFACTURING METHOD THEREOF, IMAGING APPARATUS

This is a National Phase Application filed under 35 U.S.C. 371 as a national stage of PCT/CN2016/072086, filed Jan. 26, 2016, an application claiming the benefit of Chinese Application No. 201510401838.6, filed Jul. 9, 2015, the content of each of which is hereby incorporated by reference in its entirety.

FIELD OF THE INVENTION

The present invention relates to the field of detection technology, and particularly relates to an invisible light flat plate detector and a manufacturing method thereof, and an imaging apparatus.

BACKGROUND OF THE INVENTION

In recent years, a flat plate detection technology has made a great progress. The flat plate detection technology may be divided into a direct type and an indirect type, a key component of an indirect flat plate detector is a flat plate detector (FPD) for acquiring an image. For example, FIG. 1 shows a schematic diagram of an X-ray flat plate detector of prior art. As shown in FIG. 1, the X-ray flat plate detector mainly comprises an X-ray conversion layer 11, a light detection device 12 (in general, a PIN type photodiode), and an electronic signal detection device 13 (in general, a thin film transistor). When X-rays are irradiated on the X-ray conversion layer 11, the X-ray conversion layer 11 converts the X-rays into visible light, and then the light detection device 12 converts the visible light into an electronic signal and the electronic signal is stored. Under action of a driving circuit, the thin film transistor is turned on, and the electronic signal converted by the PIN type photodiode 12 is transmitted to a data processing circuit through the thin film transistor, the data processing circuit further performs operations of amplification, analog/digital conversion or the like on the electronic signal to finally obtain an image information.

Generally, the PIN type photodiode 12 and the thin film transistor 13 in the X-ray flat plate detector are arranged in parallel, thus there is a strong interference therebetween, and since the manufacturing process of the X-ray flat plate detector is complex, it is difficult to further improve detection precision of the X-ray flat plate detector. FIG. 2 shows a schematic diagram of an X-ray flat plate detector disclosed in a U.S. patent application with a publication number of US 20120038013 A1, the X-ray flat plate detector is an X-ray flat plate detector in a vertical layout. As shown in FIG. 2, the X-ray flat plate detector comprises an X-ray conversion layer 6, a semiconductor photoelectronic conversion layer 4, a second insulation layer 9, a first electrode 3 and a second electrode (not shown in the figure, and they are arranged in parallel and in a same layer), a first insulation layer 2 and a thin film transistor 1 successively arranged from top to bottom, wherein, the semiconductor photoelectronic conversion layer 4 is configured to convert a light signal into an electronic signal, the second electrode is in contact with the semiconductor photoelectronic conversion layer 4 via a through hole penetrating through the second insulation layer 9 to stabilize the electronic signal converted by the semiconductor photoelectronic conversion layer 4, and the first electrode 3 is connected to a source electrode of the thin film transistor 1 to sense the electronic signal, and transmit the electronic signal to the data processing circuit when the thin film transistor 1 is turned on.

The inventors found that there are at least following problems in the prior art: although the X-ray flat plate detector disclosed in the U.S. patent application has a structure of vertical layout and thus can reduce signal interference, it needs to form a through hole in the second insulation layer 9 to make the second electrode, which is provided to stabilize the electronic signal converted by the semiconductor photoelectronic conversion layer 4, contact the semiconductor photoelectronic conversion layer 4, resulting in a complex process, and since the first electrode 3 and the second electrode are arranged in a same layer, both of them are not continuous plate-like electrodes, thereby the electronic signal sensed by the first electrode 3 is not strong, the electronic signal transmitted to the thin film transistor 1 is also not well, the detection precision is affected.

SUMMARY OF THE INVENTION

In view of above problems existing in the invisible light flat plate detector of prior art, an object of the present invention is to provide an invisible light flat plate detector with a small volume and a simple manufacturing process, a manufacturing method thereof, and an imaging apparatus.

In order to achieve above object, one technical solution of the present invention is an invisible light flat plate detector, which comprises a plurality of detection units and an invisible light conversion layer provided above the detection units for converting invisible light into visible light, each of the detection units comprises a thin film transistor provided on a substrate, as well as a first insulation layer, a first electrode, a semiconductor photoelectronic conversion module and a second electrode which are successively provided above the thin film transistor and of which projections on the substrate at least partially overlap with a projection of the thin film transistor on the substrate;

the semiconductor photoelectronic conversion module is configured to convert the visible light into an electronic signal;

the second electrode is directly in contact with the semiconductor photoelectronic conversion module, said second electrode is configured for stabilizing the electronic signal converted by the semiconductor photoelectronic conversion module;

the first electrode is electrically connected with a source electrode of the thin film transistor via a through hole penetrating through the first insulation layer, said first electrode is configured for transmitting the electronic signal stabilized by the second electrode to the thin film transistor, and transmitting the electronic signal to a data processing circuit when the thin film transistor is turned on.

Preferably, the first electrode is a plate-like electrode.

Preferably, the semiconductor photoelectronic conversion module at least comprises a semiconductor photoelectronic conversion layer.

Further preferably, the semiconductor photoelectronic conversion module further comprises an electron-hole transport layer and an electron transport layer;

the electron-hole transport layer is provided between the second electrode and the semiconductor photoelectronic conversion layer;

the electron transport layer is provided between the semiconductor photoelectronic conversion layer and the first electrode.

Preferably, the invisible light flat plate detector further comprises a third electrode, the third electrode is provided between the first electrode and the semiconductor photoelectronic conversion module, and is separated from the first electrode by a second insulation layer; the third electrode is configured to receive the electronic signal stabilized by the second electrode, and transmit the electronic signal to the first electrode.

Further preferably, the third electrode is made of an opaque conductive material.

Further preferably, both the first electrode and the third electrode are plate-like electrodes.

Further preferably, the semiconductor photoelectronic conversion module at least comprises a semiconductor photoelectronic conversion layer.

Further preferably, the semiconductor photoelectronic conversion module further comprises an electron-hole transport layer and an electron transport layer;

the electron-hole transport layer is provided between the second electrode and the semiconductor photoelectronic conversion layer;

the electron transport layer is provided between the semiconductor photoelectronic conversion layer and the third electrode.

Preferably, the invisible light flat plate detector further comprises a black matrix provided in a peripheral region of each detection unit, and the black matrix is located between a layer where the second electrode is located and the invisible light conversion layer.

Preferably, the invisible light flat plate detector further comprises a black matrix provided in a peripheral region of each detection unit, and the black matrix is located between a layer where the second electrode is located and the semiconductor photoelectronic conversion module.

Preferably, the projections of the first electrode, the semiconductor photoelectronic conversion module, the second electrode on the substrate completely cover the projection of the thin film transistor on the substrate.

Preferably, the invisible light is any one of X-ray, infrared ray, and ultraviolet ray.

Preferably, the second electrode is made of transparent conductive material.

In order to achieve above object, another technical solution of the present invention is a manufacturing method of the invisible light flat plate detector described above, the manufacturing method comprises steps of:

forming a thin film transistor, a first insulation layer, a first electrode, a semiconductor photoelectronic conversion module, a second electrode of each of detection units on a substrate, and forming an invisible light conversion layer; wherein the second electrode is directly in contact with the semiconductor photoelectronic conversion module.

Preferably, the manufacturing method further comprises a step of: forming a second insulation layer and a third electrode between a layer where the first electrode is located and a layer where the semiconductor photoelectronic conversion module is located.

In order to achieve above object, still another technical solution of the present invention is an imaging apparatus comprising the invisible light flat plate detector described as above.

The present invention has following advantages.

In the invisible light flat plate detector of the present invention, the projections of the first insulation layer, the first electrode, the semiconductor photoelectronic conversion module, the second electrode and the thin film transistor on the substrate at least partially overlap, that is, components of the invisible light flat plate detector of the present invention are arranged vertically, thus the invisible light flat plate detector of the present invention has a small volume and an improved performance, it is easy to achieve a design having a high resolution; moreover, since the second electrode is directly in contact with the semiconductor photoelectronic conversion module, it does not need to form a through hole as that in the prior art to make them contact, resulting in a simple manufacturing process and an improved production efficiency.

DETAILED DESCRIPTION OF THE EMBODIMENTS

In order to make persons skilled in the art better understand technical solutions of the present invention, detailed descriptions of the present invention will be provided below in conjunction with drawings and embodiments.

The present invention provides an invisible light flat plate detector, comprising a plurality of detection units and an invisible light conversion layer provided above the detection units for converting invisible light into visible light, each of the detection units comprising a thin film transistor provided on a substrate, and a first insulation layer, a first electrode, a semiconductor photoelectronic conversion module, a second electrode which are successively provided above the thin film transistor and of which projections on the substrate at least partially overlap with a projection of the thin film transistor on the substrate;

the semiconductor photoelectronic conversion module being configured to convert the visible light into an electronic signal;

the second electrode being directly in contact with the semiconductor photoelectronic conversion module for stabilizing the electronic signal converted by the semiconductor photoelectronic conversion module;

the first electrode being electrically connected with a source electrode of the thin film transistor via a through hole penetrating through the first insulation layer for transmitting the electronic signal stabilized by the second electrode to the thin film transistor, and transmitting the electronic signal to a data processing circuit when the thin film transistor is turned on.

In the present invention, the invisible light may be X-ray, infrared ray, ultraviolet ray or the like. When the invisible light is X-ray, the invisible light flat plate detector is an X-ray flat plate detector; the invisible light conversion layer is an X-ray conversion layer. Correspondingly, when the invisible light is infrared ray, the invisible light flat plate detector is an infrared ray flat plate detector; the invisible light conversion layer is an infrared ray conversion layer. Similarly, when the invisible light is ultraviolet ray or any other ray, the invisible light flat plate detector and the invisible light conversion layer are a corresponding flat plate detector and a corresponding light conversion layer. The following descriptions are given by taking the invisible light being X-ray as an example.

First Embodiment

Figure 1:
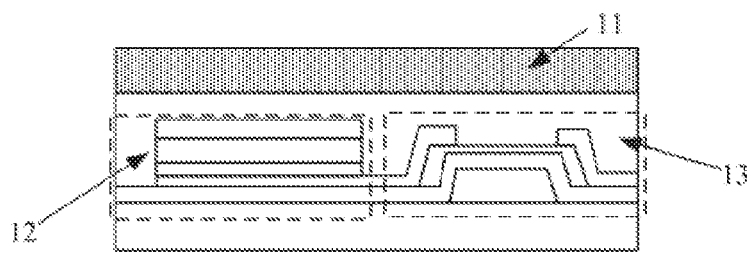
FIG. 1 is a schematic diagram showing an X-ray flat plate detector of prior art.
Figure 2:
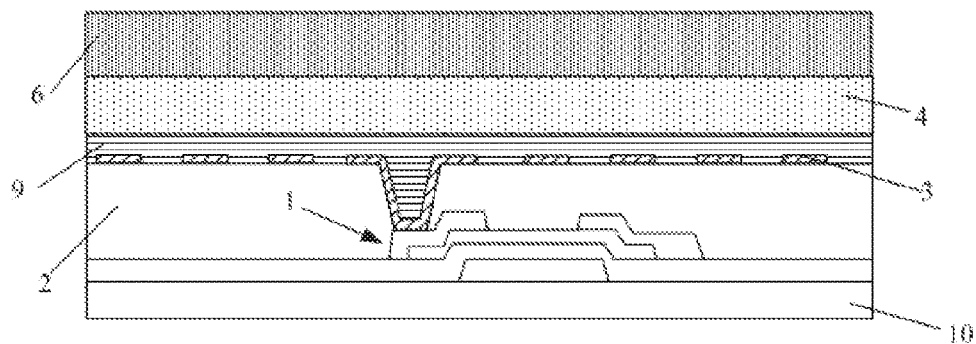
FIG. 2 is a schematic diagram showing an X-ray flat plate detector disclosed in a U.S. patent application with a publication number of US 20120038013A1.
Figure 3:
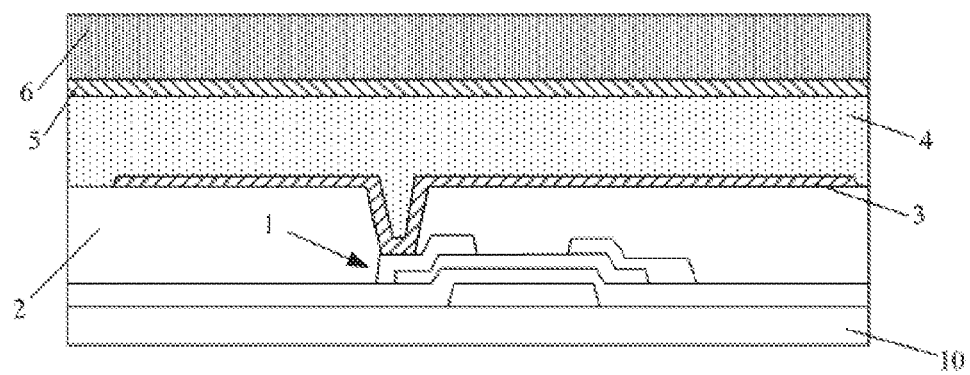
FIG. 3 is a schematic diagram showing an X-ray flat plate detector in a first embodiment of the present invention.

FIG. 3 is a schematic diagram showing an X-ray flat plate detector in the first embodiment of the present invention. As shown in FIG. 3, the present embodiment provides an X-ray flat plate detector, comprising a plurality of detection units provided on a substrate 10, and an invisible light conversion layer 6 provided above the detection units, each of the detection units comprising a thin film transistor 1, and a first insulation layer 2, a first electrode 3 (sensing/receiving electrode), a semiconductor photoelectronic conversion module 4 (which at least comprises a semiconductor photoelectronic conversion layer 41 as shown in FIGS. 5-6), a second electrode 5 which are successively provided on the substrate 10, and projections of the first insulation layer 2, the first electrode 3, the semiconductor photoelectronic conversion module 4, the second electrode 5 on the substrate 10 at least partially overlap with a projection of the thin film transistor 1 on the substrate 10.

Specifically, first, the X-ray conversion layer 6 converts the received X-ray into visible light; then, the semiconductor photoelectronic conversion module 4 is made of a material of a-Si:H, this material can generate carriers (a current signal) in accordance with visible light, thus in this case, since the second electrode 5 is directly in contact with the semiconductor photoelectronic conversion module 4, potential of the carriers may be stabilized well; the first electrode 3, as a sensing electrode and a receiving electrode, receives the current signal (an electronic signal) output by the semiconductor photoelectronic conversion module 4, and the first electrode 3 is connected to a source electrode of the thin film transistor 1, when the thin film transistor 1 is driven by an external driving circuit to be turned on, the current signal is output by a drain electrode of the thin film transistor 1 connected to the first electrode 3 and is transmitted to a data processing circuit to generate an image data, the image data is finally displayed by a display device.

Preferably, the first electrode 3 is a plate-like electrode, and in this case, it can well receive the electronic signal generated by the semiconductor photoelectronic conversion module 4, so that the detection precision of the X-ray flat plate detector is improved.

Figure 5:
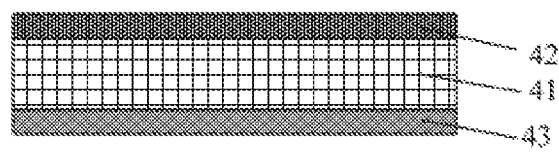
FIG. 5 is a schematic diagram showing a semiconductor photoelectronic conversion module of the X-ray flat plate detector in the first and second embodiments of the present invention.
Figure 6:
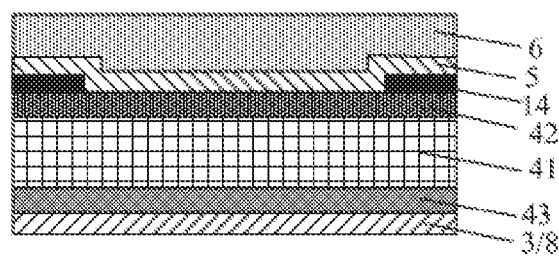
FIG. 6 is a schematic diagram showing a layout of a black matrix of the X-ray flat plate detector in the first and second embodiments of the present invention.

FIG. 5 is a schematic diagram showing a semiconductor photoelectronic conversion module of the X-ray flat plate detector in the present embodiment. As shown in FIG. 5, preferably, the semiconductor photoelectronic conversion module 4 of the present embodiment not only comprises the semiconductor photoelectronic conversion layer 41, but also comprises an electron-hole transport layer 42 and an electron transport layer 43, wherein the electron-hole transport layer 42 is provided between the second electrode 5 and the semiconductor photoelectronic conversion layer 41; the electron transport layer 43 is provided between the semiconductor photoelectronic conversion layer 41 and the first electrode 3. The electron-hole transport layer 42 is helpful for transport of charges in the semiconductor photoelectronic conversion layer 41, and the electron transport layer 43 is helpful for transport of electrons received by the first electrode 3.

FIG. 6 is a schematic diagram showing a layout of a black matrix of the X-ray flat plate detector in the present embodiment. As shown in FIG. 6, preferably, each of the detection units in the X-ray flat plate detector of the present embodiment comprises a detection region and a peripheral region surrounding the detection region, and in the present embodiment, the peripheral region of each of the detection units is provided with a pattern of a black matrix 14 therein; wherein, the black matrix 14 may be prepared before forming the second electrode 5, and also may be prepared after forming the second electrode 5; that is to say, the black matrix 14 may be provided between the second electrode 5 and the X-ray conversion layer 6, and also may be provided between the second electrode 5 and the semiconductor photoelectronic conversion module 4. Since the peripheral region of each of the detection units in the present embodiment is correspondingly provided with the black matrix 14 surrounding the detection unit, it can effectively avoid a signal crosstalk between rays of light detected by the respective detection units and thus influence thereof on the detection precision is avoided.

Preferably, the projections of the first electrode 3, the semiconductor photoelectronic conversion module 4, the second electrode 5 on the substrate 10 completely cover the projection of the thin film transistor 1 on the substrate 10, so as to reduce an area occupied by each of the detection units as much as possible, thus the pixel size of the X-ray flat plate detector is reduced and the resolution thereof is improved.

Correspondingly, the present embodiment also provides a manufacturing method of the X-ray flat plate detector described above, the manufacturing method specifically comprises steps 1 to 7.

Step 1, forming each layer structure of the thin film transistor 1 included in the detection unit on the substrate 10 by patterning processes, wherein, the manufacturing method of each layer structure of the thin film transistor 1 is well known for persons skilled in the art, thus will not be described in detail here.

Step 2, forming the first insulation layer 2 on the substrate 10 subjected to the above step, and forming a through hole at a position of the first insulation layer 2 corresponding to the source electrode of the thin film transistor 1.

The first insulation layer 2 may be of a monolayer or multilayer film structure made of one or two or three materials of silicon oxide (SiOx), silicon nitride (SiNx), hafnium oxide (HfOx), silicon oxynitride (SiOxNy), aluminum oxide (AlOx).

Step 3, forming a pattern including the first electrode 3 on the substrate 10 subjected to the above steps by a patterning process, and the first electrode 3 is connected to the source electrode of the thin film transistor 1 via the through hole formed in the step 2.

The thickness and the material of the first electrode 3 may be determined in accordance with the material of the semiconductor photoelectronic conversion module 4 to be formed subsequently, alternatively, the first electrode 3 also may be of a monolayer or multilayer structure made of one or more of molybdenum (Mo), molybdenum niobium alloy (MoNb), aluminum (Al), aluminum neodymium alloy (AlNd), titanium (Ti) and copper (Cu) generally used in display devices.

Step 4, forming a pattern including the semiconductor photoelectronic conversion module 4 on the substrate 10 subjected to the above steps by a patterning process.

Preferably, the step 4 specifically includes: successively forming the electron transport layer 43, the semiconductor photoelectronic conversion layer 41 and the electron-hole transport layer 42 on the substrate 10 subjected to the above steps.

Since the invisible light is X-ray, the material of the semiconductor photoelectronic conversion layer 41 may be a-Si:H. If the invisible light is infrared ray, the material of the semiconductor photoelectronic conversion layer 41 may be PbS.

Step 5, forming a pattern including the second electrode 5 on the substrate 10 subjected to the above steps by a patterning process.

The second electrode 5 is directly in contact with the semiconductor photoelectronic conversion module 4, and in order to make light irradiates on the semiconductor photoelectronic conversion module 4, the material of the second electrode 5 must be a transparent material. Preferably, the material structure of the second electrode 5 is ITO (indium tin oxide)/Ag (silver)/ITO (indium tin oxide), or Ag (silver)/ITO (indium tin oxide); alternatively, the ITO in the above material structure may be replaced with IZO (indium zinc oxide), IGZO (indium gallium zinc oxide) or IrGaSnO (indium gallium tin oxide).

Step 6, forming a pattern including the black matrix 14 on the second electrode 5 in the peripheral region of each of the detection units on the substrate 10 subjected to the above steps by a patterning process. This step may be omitted, but preferably it is preformed, because it can effectively avoid a signal crosstalk between rays of light detected by the respective detection units and thus influence thereof on the detection precision is avoided.

It should be noted that, the step of forming the black matrix 14 may be performed before forming the second electrode 5.

Step 7, forming the X-ray conversion layer 6 on the substrate 10 subjected to the above steps.

So far, the manufacturing of the X-ray flat plate detector is completed.

The manufacturing method of the X-ray flat plate detector in the present embodiment is simple, and it can be seen from the above method, the second electrode 5 is directly in contact with the semiconductor photoelectronic conversion module 4, in this case, the step of forming the through hole as that in the prior art to connect the second electrode 5 with the semiconductor photoelectronic conversion module 4 is omitted, thus the production efficiency of the X-ray flat plate detector is higher.

Similarly, other invisible light flat plate detectors such as an infrared ray flat plate detector, an ultraviolet ray flat plate detector or the like may be manufactured by the above method, which will not be detailed one by one here.

Second Embodiment

Figure 4:
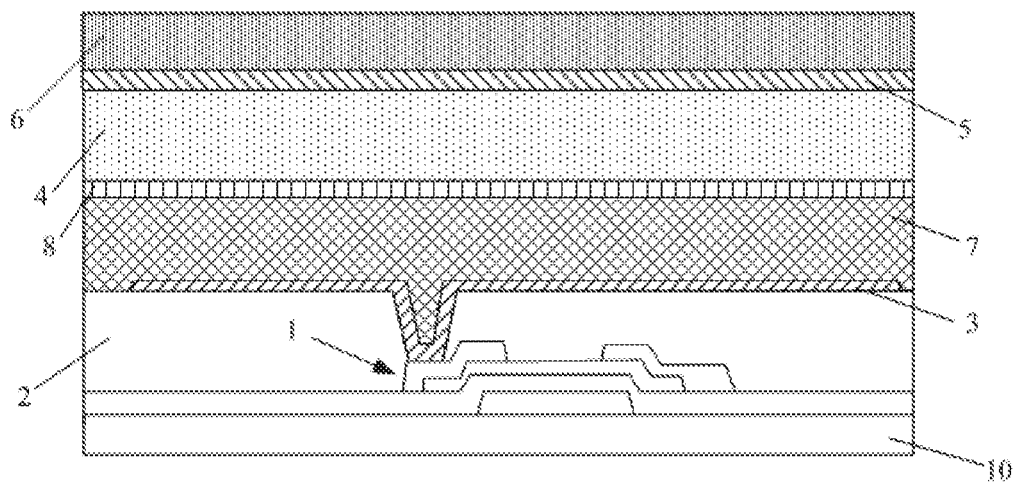
FIG. 4 is a schematic diagram showing an X-ray flat plate detector in a second embodiment of the present invention.

FIG. 4 is a schematic diagram showing an X-ray flat plate detector in the second embodiment of the present invention. As shown in FIG. 4, the present embodiment provides an X-ray flat plate detector, comprising a plurality of detection units provided on a substrate 10, and an X-ray conversion layer 6 provided above the detection units, wherein each of the detection units comprising a thin film transistor 1, and a first insulation layer 2, a first electrode 3 (sensing electrode), a second insulation layer 7, a third electrode 8 (receiving electrode), a semiconductor photoelectronic conversion module 4 (which at least comprises a semiconductor photoelectronic conversion layer 41 as shown in FIGS. 5-6), a second electrode 5 which are successively provided on the substrate 10, and projections of the first insulation layer 2, the first electrode 3, the second insulation layer 7, the third electrode 8, the semiconductor photoelectronic conversion module 4, the second electrode 5 on the substrate 10 at least partially overlap with a projection of the thin film transistor 1 on the substrate 10.

Specifically, first, the X-ray conversion layer 6 converts the received X-ray into visible light; then, the semiconductor photoelectronic conversion module 4 is made of a material of a-Si:H, this material can generate carriers (a current signal) in accordance with visible light, thus in this case, since the e second electrode 5 is directly in contact with the semiconductor photoelectronic conversion module 4, potential of the carriers may be stabilized well; the third electrode 8 as the receiving electrode receives the current signal and transmits the current signal to the first electrode 3, the first electrode 3, as a sensing electrode, senses the current signal received by the third electrode 8, at this time, the first electrode 3 outputs a capacitance signal (an electronic signal), and the first electrode 3 is connected to a source electrode of the thin film transistor 1, when the thin film transistor 1 is driven by an external driving circuit to be turned on, the capacitance signal is output by a drain electrode of the thin film transistor 1 connected to the first electrode 3 and is transmitted to a data processing circuit to generate an image data, the image data is finally displayed by a display device.

It should be noted that, in the present embodiment, the first electrode 3 and the third electrode 8 are preferably plate-like electrodes, and they are provided opposite to each other to form a capacitor. Since both the first electrode 3 and the third electrode 8 are plate-like electrodes, the sensing sensitivity and the receiving precision are greatly improved, thus the detection precision of the X-ray flat plate detector is improved. Certainly, the first electrode 3 may he a plurality of electrodes separated from each other, each of which has a small area, as long as the third electrode 8 completely covers the thin film transistor 1.

Preferably, the photoelectronic conversion module 4 in the present embodiment not only comprises the semiconductor photoelectronic conversion layer 41, but also comprises the electron-hole transport layer 42 and the electron transport layer 43, wherein the electron-hole transport layer 42 is provided between the second electrode 5 and the semiconductor photoelectronic conversion layer 41; the electron transport layer 43 is provided between the semiconductor photoelectronic conversion layer 41 and the third electrode 8. The electron-hole transport layer 42 is helpful for transport of charges in the semiconductor photoelectronic conversion layer 41, and the electron transport layer 43 is helpful for transport of electrons received by the third electrode 8.

Preferably, each of the detection units in the X-ray flat plate detector of the present embodiment comprises a detection region and a peripheral region surrounding the detection region, and in the present embodiment, the peripheral region of each of the detection units is provided with a pattern of a black matrix 14 therein; wherein, the black matrix 14 may be prepared before forming the second electrode 5, and also may be prepared after forming the second electrode 5; that is to say, the black matrix 14 may be provided between the second electrode 5 and the X-ray conversion layer 6, and also may be provided between the second electrode 5 and the semiconductor photoelectronic conversion module 4. Since the peripheral region of each of the detection units in the present embodiment is correspondingly provided with the black matrix 14 surrounding the detection unit, it can effectively avoid a signal crosstalk between rays of light detected by the respective detection units and thus influence thereof on the detection precision is avoided. Preferably, the projections of the first electrode 3, the third electrode 8, the semiconductor photoelectronic conversion module 4, the second electrode 5 on the substrate 10 completely cover the projection of the thin film transistor 1 on the substrate 10, so as to reduce an area occupied by each of the detection units as much as possible, thus the pixel size of the X-ray flat plate detector is reduced and the resolution thereof is improved.

Correspondingly, the present embodiment also provides a manufacturing method of the X-ray flat plate detector described above, the manufacturing method specifically comprises steps 1 to 9.

Step 1, forming each layer structure of the thin film transistor 1 included in the detection unit on the substrate 10 by patterning processes, wherein, the manufacturing method of each layer structure of the thin film transistor 1 is well known for persons skilled in the art, thus will not be described in detail here.

Step 2, forming the first insulation layer 2 on the substrate 10 subjected to the above step, and forming a through hole at a position of the first insulation layer 2 corresponding to the source electrode of the thin film transistor 1.

The first insulation layer 2 may be of a monolayer or multilayer film structure made of one or two or three materials of silicon oxide (SiOx), silicon nitride (SiNx), hafnium oxide (HfOx), oxynitride (SiOxNy), aluminum oxide (AlOx).

Step 3, forming a pattern including the first electrode 3 on the substrate 10 subjected to the above steps by a patterning process, and the first electrode 3 is connected to the source electrode of the thin film transistor 1 via the through hole formed in the step 2.

The thickness and the material of the first electrode 3 may be determined in accordance with the material of the semiconductor photoelectronic conversion module 4 to be formed subsequently, alternatively, the first electrode 3 also may be of a monolayer or multilayer structure made of one or more of molybdenum (Mo), molybdenum niobium alloy (MoNb), aluminum (Al), aluminum neodymium alloy (AlNd), titanium (Ti) and copper (Cu) generally used in display devices.

Step 4, forming the second insulation layer 7 on the substrate 10 subjected to the above steps.

The second insulation layer 7 may be of a monolayer or multilayer film structure made of one or two or three materials of silicon oxide (SiOx), silicon nitride (SiNx), hafnium oxide (HfOx), silicon oxynitride (SiOxNy), aluminum oxide (AlOx), and may have a thickness ranging from 10 nm to 20 nm.

Step 5, forming a pattern including the third electrode 8 on the substrate 10 subjected to the above steps by a patterning process.

The third electrode 8 is made of opaque metal for blocking irradiation of light on the thin film transistor 1.

Step 6, forming a pattern including the semiconductor photoelectronic conversion module 4 on the substrate 10 subjected to the above steps by a patterning process.

Preferably, the step 6 specifically includes: successively forming the electron transport layer 43, the semiconductor photoelectronic conversion layer 41 and the electron-hole transport layer 42 on the substrate 10 subjected to the above steps.

Since the invisible light is X-ray, the material of the semiconductor photoelectronic conversion layer 41 may be a-Si:H. If the invisible light is infrared ray, the material of the semiconductor photoelectronic conversion layer 41 may be PbS.

Step 7, forming a pattern including the second electrode 5 on the substrate 10 subjected to the above steps by a patterning process.

The second electrode 5 is directly in contact with the semiconductor photoelectronic conversion module 4, and in order to make light irradiates on the semiconductor photoelectronic conversion module 4, the material of the second electrode 5 must be a transparent material. Preferably, the material structure of the second electrode 5 is ITO (indium tin oxide)/Ag (silver/ITO (indium tin oxide), or Ag (silver)/ITO (indium tin oxide); alternatively, the ITO in the above material structure may be replaced with IZO (indium zinc oxide), IGZO (indium gallium zinc oxide) or InGaSnO (indium gallium tin oxide).

Step 8, forming a pattern including the black matrix 14 on the second electrode 5 in the peripheral region of each of the detection units on the substrate 10 subjected to the above steps by a patterning process. This step may be omitted, but preferably it is preformed, because it can effectively avoid a signal crosstalk between rays of light detected by the respective detection units and thus influence thereof on the detection precision is avoided.

It should be noted that, the step of forming the black matrix 14 may be performed before forming the second electrode 5.

Step 9, forming the X-ray conversion layer 6 on the substrate 10 subjected to the above steps.

So far, the manufacturing of the X-ray flat plate detector is completed.

The manufacturing method of the X-ray flat plate detector in the present embodiment is simple, and it can be seen from the above method, the second electrode 5 is directly in contact with the semiconductor photoelectronic conversion module 4, in this case, the step of forming the through hole as that in the prior art to connect the second electrode 5 with the semiconductor photoelectronic conversion module 4 is omitted, thus the production efficiency of the X-ray flat plate detector is higher.

Similarly, other invisible light flat plate detectors such as an infrared ray flat plate detector, an ultraviolet ray flat plate detector or the like may be manufactured by the above method, which will not be detailed one by one here.

Third Embodiment

The present embodiment provides an imaging apparatus. The imaging apparatus may comprise the X-ray flat plate detector of the first or second embodiment. The imaging apparatus may be any product or component having displaying function, such as a liquid crystal panel, an electronic paper, an OLED panel, a mobile phone, a tablet computer, a display device, a notebook computer or the like.

Of course, when the invisible light is from other light source such as an infrared ray source, an ultraviolet ray source or the like, the imaging apparatus also may correspondingly comprise an infrared ray flat plate detector, an ultraviolet ray flat plate detector or the like.

It should be understood that, the foregoing implementations are merely exemplary implementations for explaining the principle of the present invention, but the present invention is not limited thereto. Persons skilled in the art can make various variations and improvements without departing from the spirit and scope of the present invention, and these variations and improvements also fall within the protection scope of the present invention.

The invention claimed is:

1. An invisible light flat plate detector, comprising; a plurality of detection units and an invisible light conversion layer provided above the detection units for converting invisible light into visible light, wherein each of the detection units comprises a thin film transistor provided on a substrate, as well as a first insulation layer, a first electrode, a semiconductor photoelectronic conversion module and a second electrode which are successively provided above the thin film transistor and of which projections on the substrate at least partially overlap with a projection of the thin film transistor on the substrate;

the semiconductor photoelectronic conversion module is configured to convert the visible light into an electronic signal;

the second electrode is directly in contact with the semiconductor photoelectronic conversion module, said second electrode is configured for stabilizing the electronic signal converted by the semiconductor photoelectronic conversion module; and the first electrode is electrically connected with a source electrode of the thin film transistor via a through hole penetrating through the first insulation layer, said first electrode is configured for transmitting the electronic signal stabilized by the second electrode to the thin film transistor, and transmitting the electronic signal to a data processing circuit when the thin film transistor is turned on, wherein the semiconductor photoelectronic conversion module at least comprises a semiconductor photoelectronic conversion layer, and the semiconductor photoelectronic conversion layer is a photodiode.

2. The invisible light flat plate detector of claim 1, wherein, the semiconductor photoelectronic conversion module further comprises an electron-hole transport layer and an electron transport layer;

the electron-hole transport layer is provided between the second electrode and the semiconductor photoelectronic conversion layer; and the electron transport layer is provided between the semiconductor photoelectronic conversion layer and the first electrode.

3. The invisible light flat plate detector of claim 1, wherein, the invisible light flat plate detector further comprises a black matrix provided in a peripheral region of each detection unit, and the black matrix is located between a layer where the second electrode is located and the semiconductor photoelectronic conversion module.

4. The invisible light flat plate detector of claim 1, wherein, the invisible light flat plate detector further comprises a black matrix provided in a peripheral region of each detection unit, and the black matrix is located between a layer where the second electrode is located and the invisible light conversion layer.

5. The invisible light flat plate detector of claim 1, wherein, the projections of the first electrode, the semiconductor photoelectronic conversion module, and the second electrode on the substrate completely cover the projection of the thin film transistor on the substrate.

6. The invisible light flat plate detector of claim 1, wherein, the invisible light is any one of X-ray, infrared ray, and ultraviolet ray.

7. The invisible light flat plate detector of claim 1, wherein, the second electrode is made of transparent conductive material.

8. The invisible light flat plate detector of claim 1, wherein the first electrode is a plate-like electrode.

9. An imaging apparatus, comprising the invisible light flat plate detector of claim 1.

10. The invisible light flat plate detector of claim 1, wherein, the invisible light flat plate detector further comprises a third electrode, the third electrode is provided between the first electrode and the semiconductor photoelectronic conversion module, and is separated from the first electrode by a second insulation layer; the third electrode is configured to receive the electronic signal stabilized by the second electrode, and transmit the electronic signal to the first electrode.

11. The invisible light flat plate detector of claim 10, wherein, the semiconductor photoelectronic conversion module further comprises an electron-hole transport layer and an electron transport layer;

the electron-hole transport layer is provided between the second electrode and the semiconductor photoelectronic conversion layer; and the electron transport layer is provided between the semiconductor photoelectronic conversion layer and the third electrode.

12. The invisible light flat plate detector of claim 10, wherein, both the first electrode and the third electrode are plate-like electrodes.

13. The invisible light flat plate detector of claim 10, wherein, the third electrode is made of an opaque conductive material.

14. A manufacturing method of the invisible light flat plate detector of claim 1, the manufacturing method comprises steps of:

forming a thin film transistor, a first insulation layer, a first electrode, a semiconductor photoelectronic conversion module, and a second electrode of each of detection units on a substrate; and forming an invisible light conversion layer; wherein the second electrode is directly in contact with the semiconductor photoelectronic conversion module.

15. The manufacturing method of claim 14, further comprises a step of: forming a second insulation layer and a third electrode between a layer where the first electrode is located and a layer where the semiconductor photoelectronic conversion module is located.

\* \* \* \* \*